Dec. 2, 1969 R. L. JAMES 3,482,116

VOLTAGE TO FREQUENCY CONVERTER

Filed Aug. 5, 1966

INVENTOR.
ROBERT L. JAMES
BY Herbert L. Davis
ATTORNEY

United States Patent Office 3,482,116
Patented Dec. 2, 1969

3,482,116
VOLTAGE TO FREQUENCY CONVERTER
Robert L. James, Bloomfield, N.J., assignor to The Bendix Corporation, a corporation of Delaware
Filed Aug. 5, 1966, Ser. No. 570,666
Int. Cl. H03k 5/13
U.S. Cl. 307—261 7 Claims

ABSTRACT OF THE DISCLOSURE

Apparatus for providing pulses at a frequency corresponding to the amplitude of an input signal includes an amplifier and a capacitor connected in feedback relation thereto, and a current flow control device connected across the capacitor. A comparator compares the amplifier output to a biasing voltage and another current flow control device is responsive to the comparator output for operating the first mentioned current flow control device when the compared voltages are equal whereby charging and discharging paths for the capacitor are alternately provided so that the amplifier output has a sawtooth waveform with a frequency corresponding to the input signal.

This invention relates to means for providing output pulses in response to an input signal and, more particularly, to means for providing the output pulses at a frequency corresponding to the amplitude of the input signal.

Heretofore, converters for converting input signals into corresponding pulse outputs, such as used in electronic devices of the type disclosed and broadly claimed in the copending U.S. application Ser. No. 558,327, filed June 17, 1966, by Robert L. James and assigned to The Bendix Corporation, assignee of the present invention, have been relatively unstable and have had slow response. Moreover, it has been necessary to include redundant circuitry so as to render the converters responsive to both positive and negative input signals.

One object of this invention is to provide novel means having simplified circuitry for converting positive and negative input signals into corresponding pulse outputs.

Another object of this invention is to provide novel means, having fast response and improved stability, for converting an input signal into pulses having a frequency corresponding to the amplitude of the input signal.

This invention contemplates a device for converting an input signal into output pulses comprising: first means responsive to the input signal for providing an output correspoding thereto; second means connected to the first means and responsive to the output therefrom for providing a controlling output; and third means connected to the first means and connected to the second means and rendered effective by the controlling output from the second means for controlling the first means so as to effect upon the output therefrom a predetermined wave form, and for providing said output pulses during a predetermined excursion of said output of the predetermined wave form.

These and other objects and features of the invention are pointed out in the following description in terms of the embodiment thereof which is shown in the accompanying drawings. It is to be understood, however, that the drawings are for the purpose of illustration only and are not a definition of the limits of the invention, reference being had to the appended claims for this purpose.

Figures 1, 2, 3:
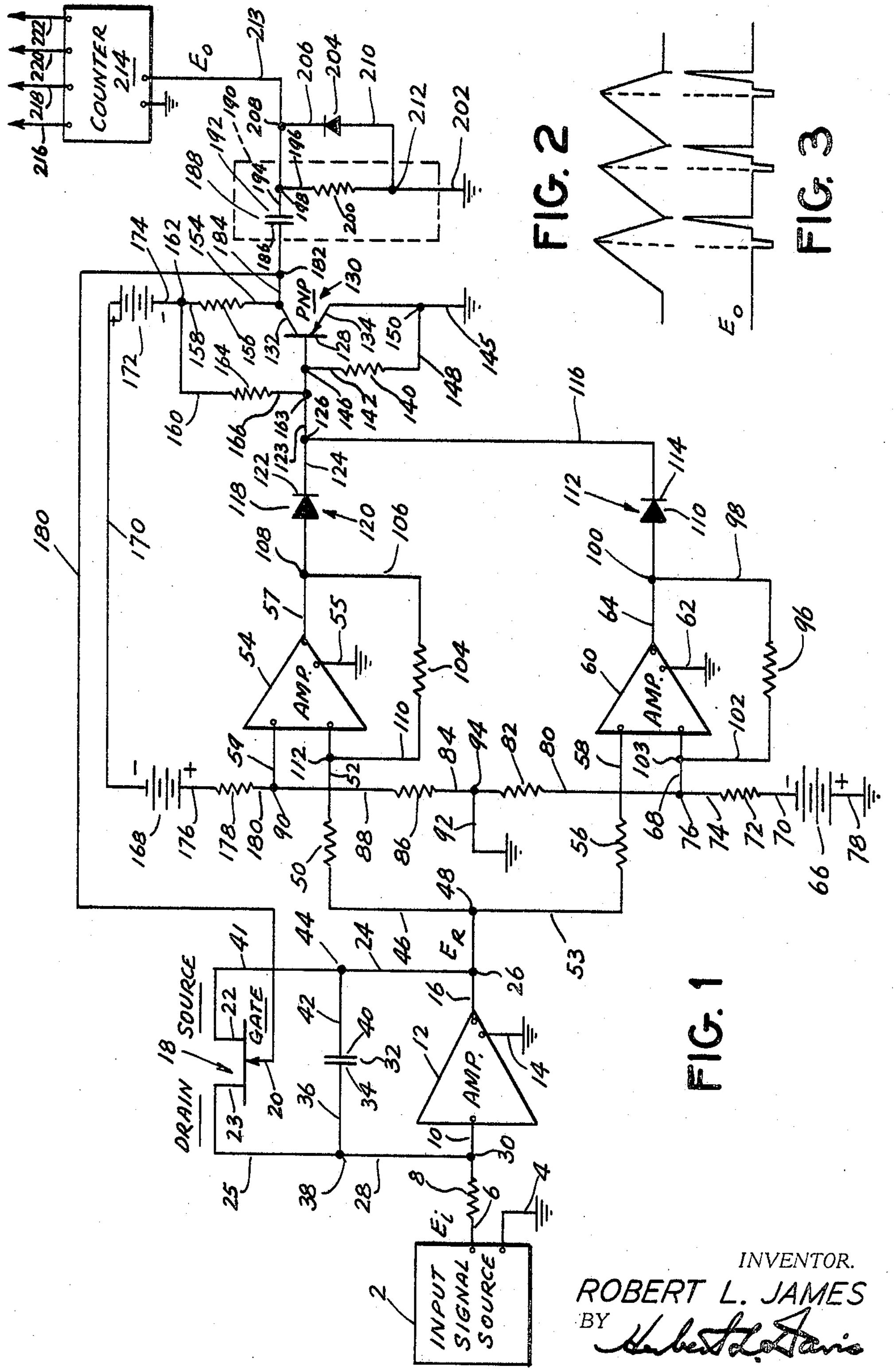
FIGURE 1 is an electrical circuit diagram of the voltage to frequency converter constructed in accordance with the present invention.
FIGURE 2 is a graphical representation of the ramp voltage $E_R$ effected in the voltage to frequency converter network of FIGURE 1.
FIGURE 3 is a graphical representation of the output pulses $E_0$ effected by the voltage to frequency network of FIGURE 1.

With reference to FIGURE 1, an input signal source 2 having a grounded output conductor 4 and an output conductor 6 provides at the output conductor 6 a direct current or demodulated alternating current input signal $E_I$ such as is used in a flight control system or other servo system. The input signal $E_I$ is applied through a resistor 8 and an input conductor 10 to an amplifier 12 having a grounded input-output conductor 14 and an output conductor 16.

A capacitor 32 is connected in the feedback path of the amplifier 12. The capacitor 32 has a plate 40 connected to the output conductor 16 of the amplifier 12 through a conductor 24 joining the output conductor 16 of the amplifier 12 at a point 26 and joining a conductor 42 leading to the plate 40 at a point 44. A plate 34 of the capacitor 32 is connected to the input conductor 10 of the amplifier 12 through a conductor 28 joining the input conductor 10 at a point 30 and joining a conductor 36 leading to the plate 34 at a point 38. The input resistor 8, the amplifier 12 and the capacitor 32, thus in a typical integrator type connection, operate to provide at the output conductor 16 of the amplifier 12 a ramp voltage $E_R$ corresponding to the integral of the input signal $E_I$ from the input signal source 2. The ramp voltage $E_R$ is positive going or negative going in accordance with the polarity of the input signal $E_I$.

The ramp voltage $E_R$ is applied through the output conductor 16, a conductor 46 joining the output conductor 16 at a point 48, a resistor 50, and an input conductor 52 to an amplifier 54 having a grounded input-output conductor 55 and an output conductor 57. The ramp voltage $E_R$ is also applied through the output conductor 16, a conductor 53 joining the output conductor 16 at the point 48, a resistor 56, and an input conductor 58 to an ampilfier 60 having a grounded input-output conductor 62 and an output conductor 64.

The negative terminal of a suitable source of direct current shown as a battery 66 is connected to an input conductor 68 of the amplifier 60 through a conductor 70, a resistor 72 and a conductor 74 joining the input conductor 68 at point 76 so as to supply a negative bias to the amplifier 60. The positive terminal of the battery 66 is connected to a grounded conductor 78. The input conductor 68 of the amplifier 60 is connected to an input conductor 59 of the amplifier 54 through a conductor 80 joining the input conductor 68 at the point 76, a resistor 82, a conductor 84, a resistor 86 and a conductor 88 joining the inqut conductor 59 at a point 90. The conductor 84 is connected to a grounded conductor 92 at a point 94.

A resistor 96 is connected in the feedback path of the amplifier 60 through a conductor 98 joining the output conductor 64 of the amplifier 60 at a point 100, and a conductor 102 joining the input conductor 68 of the amplifier 60 at a point 103. A resistor 104 is connected in the feedback path of the amplifier 54 through a conductor 106 joining the output conductor 57 of the amplifier 54 at a point 108 and a conductor 110 joining the input conductor 52 of the amplifier 54 at a point 112.

The output conductor 64 of the amplifier 60 is connected to an anode 110 of a diode 112 with the diode 112 having a cathode 114. The output conductor 57 of the amplifier 54 is connected to an anode 118 of a diode 120 with the diode 120 having a cathode 122. The cathode 114 of the diode 112 is connected to the cathode 122 of the diode 120 through a conductor 116 leading from the cathode 114 of the diode 112 and joining at a point 126 a conductor 124 leading from the cathode 122 of the diode 120. The diodes 112 and 120 connected as shown in FIGURE 1 provide an OR circuit whereby either the output from the amplifier 60 or the output from the amplifier 54 is provided at a conductor 123 leading from the point 126, with the conductor 123 leading to a base 128 of a PNP type transistor 130. The transistor 130 has a collector 132 and an emitter 134, with the emitter 134 connected to a grounded conductor 145.

A resistor 140 is connected across the emitter 134 and the base 128 of the PNP type transistor 130 through a conductor 142 joining the conductor 123 leading to the base 128 at a point 146, and a conductor 148 connected to the grounded conductor 145 leading from the emitter 134 at a point 150. A resistor 164 is connected across the base 128 and the collector 132 of the PNP transistor 130 through a conductor 154 leading from the collector 132, a resistor 156, a conductor 158, a conductor 160 joining the conductor 158 at a point 162, a resistor 164 and a conductor 166 joining the conductor 123 at a point 163.

The negative terminal of a suitable source of direct current shown as a battery 168 is connected through a conductor 170 to the positive terminal of a suitable source of direct current shown as a battery 172. The negative terminal of the battery 172 is connected to the collector 132 of the PNP type transistor 130 through a conductor 174, the conductor 158 joining the conductor 174 at the point 162, the resistor 156 and the conductor 154 leading to the collector 132, so as to supply a negative bias to the PNP type transistor 130. The positive terminal of the battery 168 is connected to the input conductor 59 of the amplifier 54 through a conductor 176, a resistor 178 and a conductor 180 joining the input conductor 59 at the point 90, so as to supply a positive bias to the amplifier 54.

A field effect transistor 18 having a gate element 20, a source element 22 and a drain element 23 is connected across the capacitor 32 in the feedback path of the amplifier 12. The drain element 23 of the field effect transistor 18 is connected to the plate 34 of the capacitor 32 through a conductor 25 leading from the drain element 23 and joining the conductor 36 leading to the plate 34 at the point 38. The source element 22 of the field effect transistor 18 is connected to the plate 40 of the capacitor 32 through a conductor 41 leading from the source element 22 and joining the conductor 42 leading to the plate 40 at the point 44.

The collector 132 of the PNP type transistor 130 is connected to the gate element 20 of the field effect transistor 18 through a conductor 180 leading from the gate element 20 and joining at a point 182 a conductor 184 leading from the collector 132. The collector 132 of the PNP type transistor 130 is connected to a plate 186 of a capacitor 188 included in a differentiating network 190, with the differentiating network 190 also including a resistor 200. A plate 192 of the capacitor 188 is connected to a grounded conductor 202 through a conductor 194, a conductor 196 joining the conductor 194 at a point 198 and the resistor 200.

A diode 204 is connected to the grounded conductor 202 and to the conductor 194 connected to the plate 192 of the capacitor 188 through a conductor 206 joining the conductor 194 at a point 208 and a conductor 210 joining the grounded conductor 202 at a point 212, so as to provide at an output conductor 213 leading from the point 208 the output pulse $E_o$. The output pulse $E_o$ has a frequency corresponding to the amplitude of the input signal $E_i$ from the input signal source 2, and is applied through the output conductor 213 to a counter 214. The counter 214 may be a device such as that described and broadly claimed in the co-pending U.S. application Ser. No. 603,631, filed Dec. 21, 1966, by Robert L. James, and assigned to The Bendix Corporation, assignee of the present invention. The counter 214 has a plurality of output conductors shown for purposes of example as being four in number and designated by the numerals 216, 218, 220 and 222. A binary bit of the total number of the pulses $E_o$ is provided at each of the output conductors 216, 218, 220 and 222.

Operation

The amplifier 12, the capacitor 32 in the feedback path of the amplifier 12 and the input resistor 8, function as an integrator to provide at the output conductor 16 of the amplifier 12 the ramp voltage $E_F$, with the ramp voltage $E_R$ corresponding to the integral of the input signal $E_i$.

The ramp voltage $E_R$ is applied through the resistor 56 to the amplifier 60 and through the resistor 50 to the amplifier 54. The amplifier 60 compares the ramp voltage $E_R$ applied through the resistor 56 to the negative bias voltage provided by the battery 66. When the ramp voltage $E_R$ is equal to the negative bias voltage provided by the battery 66, regenerative action occurs through the resistor 96 connected in the feedback path of the amplifier 60.

The amplifier 60 is triggered, and the output therefrom at the output conductor 64 changes from a saturated state of one polarity to a saturated state of the opposite polarity, with the output being applied through the diode 112 to the transistor 130. The transistor 130 being biased by the battery 172 provides a pulse at the output conductor 184. The pulse at the output conductor 184 of the transistor 130 is applied through the conductor 180 joining the conductor 184 at the point 182 to the gating terminal 20 of the field effect transistor 18 connected across the capacitor 32 in the feedback path of the amplifier 12, and in which the drain terminal 23 is connected to the input conductor 10 of the amplifier 12 while the source terminal 22 is connected to the output conductor 16 of the amplifier 12.

The field effect transistor 18 is rendered conductive upon a negative going pulse being applied through the conductor 180 to the gating terminal 20, whereupon the capacitor 32 discharges through the field effect transistor 18, causing a drop in the ramp voltage $E_R$ provided at the output conductor 16 of the amplifier 12. When the drop in the ramp voltage $E_R$ is sufficient to overcome the hysteresis in the feedback path of the amplifier 60, the output of the amplifier 60 at the output conductor 64 changes back to its prior saturated state.

The output of the amplifier 60 at the output conductor 64 is applied through the diode 112 to the transistor 130 which controls, through the conductor 180, the field effect transistor 18 so as to render the field effect transistor 18 cut off, and the capacitor 32 effective in the feedback loop of the amplifier 12 to initiate a new charging cycle.

The ramp voltage $E_R$ at the ouput conductor 16 of the amplifier 12, as controlled by the positive going pulse applied through conductor 180 to the gating terminal 20 of the field effect transistor 18, thus has a saw tooth wave form as illustrated in the graphical representation of FIGURE 2, and has a frequency depending on the input signal amplitude, the characteristics of the input resistor 8, the capacitor 32, the hysteresis in the feedback path of the amplifier 60, the level of the bias voltage provided by the battery 66, and the resulting output applied through the output conductor 64 and diode 112 by the amplifier 60 to the transistor 130 which in turn controls through conductor 180 the field effect transistor 18.

The amplifier 54 is biased by a positive voltage from a battery 168, and operates in a manner as heretofore noted with reference to the amplifier 60 so as to be responsive to a positive going ramp voltage $E_R$, with the amplifiers 54 and 60 thereby rendering the transistor 130 and the field effect transistor 18 responsive to positive and negative going ramp voltages $E_R$. Also, the corresponding bias and input conductors 59 and 68, and 52 and 58, respectively, of the amplifiers 54 and 60, are connected to the amplifiers 54 and 60 in reverse relation to each other, thereby providing corresponding pulses at the output conductors 57 and 64, although the amplifier 60 responds to a negative going ramp voltage $E_R$ and the amplifier 54 responds to a positive going ramp voltage $E_R$.

The output of the amplifier 54 at the output conductor 57 is applied through the diode 120 and therefrom to the transistor 130 to drive the field effect transistor 18, as heretofore noted, with reference to the operation of the amplifier 60.

The pulse at the conductor 184 leading from the collector 132 of the PNP type transistor 130 occurs for the interval of time during which the capacitor 32 in the feedback path of the amplifier 12 discharges. This pulse is applied through the output conductor 184 to the differentiator 190 including the capacitor 188 and the resistor 200. The differentiator 190 differentiates the pulse to provide a pulse at the output conductor 194. The negative going portion of the pulse at the output conductor 194 is clipped by the diode 204 so as to provide an output pulse $E_o$ having a waveform as illustrated in the graphical representation of FIGURE 3, with the positive portion of said pulse driving the counter 214. Since the ramp voltage $E_R$ provided at the output conductor 16 of the amplifier 12 corresponds to the integral of the input signal $E_i$, and since the frequency of the saw tooth waveform effected upon the ramp voltage $E_R$ by the amplifiers 54 and 60 depends upon a predetermined level of the ramp voltage $E_R$, the frequency of the pulse $E_o$ at the output conductor 213 corresponds to the amplitude of the signal $E_i$.

The amplifier 12, the amplifiers 54 and 60, the transistor 130 and the field effect transistor 18 connected as shown in FIGURE 1, provide fast response to input signals $E_i$ of varying amplitudes. Moreover, the field effect transistor 18 may be of the metal oxide shield depletion mode type having temperature stable drain to gate and drain to source leakage resistance. A transistor of this type provides increased stability in that it minimizes changes in the frequency of the output $E_o$ resulting from ambient temperature changes. Since the amplifiers 54 and 60 render the device responsive to both positive and negative input signals $E_i$, and since the outputs of the amplifiers 54 and 60 are applied through the OR circuit including the diodes 112 and 120 to drive the transistor 130, the voltage to frequency converter constructed in accordance with the present invention is rendered responsive to input signals of both polarities without the need for redundant circuitry. This feature renders the device of the present invention particularly adaptable to aerospace applications where space is at a minimum and reliability must be high.

Although only one embodiment of the invention has been illustrated and described, various changes in the form and relative arrangements of the parts, which will now appear to those skilled in the art may be made without departing from the scope of the invention.

What is claimed is:

1. Apparatus for converting an input signal from a signal source into pulses having a frequency corresponding to the input signal amplitude, comprising:

an integrator including an amplifier having input and output terminals, a resistor for connecting the amplifier input terminal to the signal source and a capacitor connected in feedback relation to said input and output terminals, and providing at the amplifier output terminal a ramp output which is the integral of the input signal;

a first current flow control device connected across the capacitor;

means for providing biasing voltage;

a comparator including amplifier means initially saturated in one sense connected to the output terminal of the integrator amplifier and connected to the biasing voltage means for comparing the ramp output and the biasing voltage, whereupon the amplifier means switches to saturation in an opposite sense when said compared voltages are substantially equal;

a second current flow control device connected to the comparator and responsive to the output therefrom when said amplifier means is saturated in the one and the opposite senses for providing a controlling pulse; and the first current flow control device connected to the second current flow control device and responsive to the controlling pulse therefrom to be alternately rendered conductive and nonconductive so that the capacitor discharges and charges, respectively, to provide the ramp output at the integrator amplifier output terminal having a sawtooth waveform with a frequency corresponding to the input signal amplitude.

2. Apparatus as described by claim 1, wherein:

the means for providing biasing voltage includes means for providing biasing voltage in one sense and means for providing biasing voltage in an opposite sense;

the amplifier means in the comparator includes a first amplifier initially saturated in the one sense and connected to the output terminal of the integrator amplifier, and connected to the means for providing biasing voltage in the one sense for comparing the ramp voltage to said biasing voltage in the one sense and switching to saturation in the opposite sense when said compared voltages are substantially equal; and said amplifier means in the comparator further includes a second amplifier initially saturated in the opposite sense and connected to the output terminal of the integrator amplifier, and connected to the means for providing biasing voltage in the opposite sense for comparing the ramp voltage to said biasing voltage in the opposite sense and switching to saturation in the one sense when said compared voltages are substantially equal.

3. Apparatus as described by claim 2, including:

a first feedback resistor connected in a feedback path to the first amplifier for affecting said amplifier so that when the ramp voltage is sufficient to overcome hysteresis in said feedback path the first amplifier switches back to its prior saturated state; and a second feedback resistor connected in a feedback path to the second amplifier for affecting said amplifier so that when the ramp voltage is sufficient to overcome hysteresis in said feedback path the second amplifier switches back to its prior saturated state.

4. Apparatus as described by claim 2, including gating means connected intermediate the comparator and the second current flow control device, said gating means comprising:

a third current flow control device connected to the first amplifier;

a fourth current flow control device connected to the second amplifier;

connecting means for connecting the third and fourth current flow control devices to the second current flow control device; and said third and fourth current flow control devices cooperating to provide one of the outputs of the first and second amplifiers at said connecting means.

5. Apparatus as described by claim 1, wherein the first current flow control device includes:

a field effect transistor having gate, source and drain elements;

the drain element connected to the integrator amplifier input terminal;

the source element connected to the integrator amplifier output terminal; and the gate element connected to the second current flow control device.

6. Apparatus as described by claim 5, wherein the second current flow control device includes:

a transistor having base, emitter and collector elements;

the base element connected to the comparator;

means for providing a biasing voltage connected to the collector element;

the emitter element connected to ground;

a resistor connected across the base and emitter elements;

a resistor connected across the base and collector elements;

the collector element connected to the gate element of the field effect transistor; and the controlling pulse being provided at the collector elements.

7. Apparatus as described by claim 6 including:

a differentiator connected to the collector element of the transistor for differentiating the controlling pulse during a predetermined excursion of the sawtooth output from the integrator amplifier and for thereby providing pulse spikes of opposing senses; and clipping means connected to the differentiator for clipping the spikes of one of said senses to a predetermined level.

References Cited

UNITED STATES PATENTS

| | | | |
|---|---|---|---|
| 3,040,273 | 6/1962 | Boff. | |
| 3,060,388 | 10/1962 | Ball et al. | 307—229 XR |
| 3,114,114 | 12/1963 | Atherton et al. | 331—177 XR |
| 3,119,029 | 1/1964 | Russell | 328—127 XR |
| 3,214,708 | 10/1965 | Chamberlain. | |
| 3,277,395 | 10/1966 | Grindle et al. | 307—228 XR |
| 3,302,040 | 1/1967 | Dryden | 307—228 |
| 3,350,574 | 10/1967 | James | 307—261 |

DONALD D. FORRER, Primary Examiner

STANLEY T. KRAWCZEWICZ, Assistant Examiner

U.S. Cl. X.R.

307—228, 235, 236, 262; 328—31, 115, 127, 151